United States Patent [19]
Loewenhardt et al.

[11] Patent Number: 5,565,681
[45] Date of Patent: Oct. 15, 1996

[54] ION ENERGY ANALYZER WITH AN ELECTRICALLY CONTROLLED GEOMETRIC FILTER

[75] Inventors: Peter Loewenhardt, Campbell; Gerald Z. Yin, Cupertino, both of Calif.

[73] Assignee: Applied Materials, Inc., Santa Clara, Calif.

[21] Appl. No.: 409,389

[22] Filed: Mar. 23, 1995

[51] Int. Cl.$^6$ ............................................. H01J 49/48
[52] U.S. Cl. ..................................... 250/305; 250/397
[58] Field of Search ............................... 250/305, 397, 250/492.21; 313/103 CM, 105 CM

[56] References Cited

U.S. PATENT DOCUMENTS

| 5,280,176 | 1/1994 | Jach et al. ............................. | 250/305 |
| 5,451,784 | 9/1995 | Loewenhardt et al. .................. | 250/305 |

OTHER PUBLICATIONS

Stenzel et al., "Novel Directional Ion Energy Analyzer", Rev. Sci. Instrum. 53(7), Jul. 1982, pp. 1027–1031.
Liu et al., "Ion Bombardment in RF Plasmas", J. Appl. Phys. 68(8), 15 Oct. 1990, pp. 3916–3934.

*Primary Examiner*—Jack I. Berman
*Assistant Examiner*—Kiet T. Nguyen
*Attorney, Agent, or Firm*—Thomason & Moser

[57] ABSTRACT

An ion energy analyzer having a micro-channel plate where the geometric filtering characteristics of the micro-channel plate are electrically controlled. The ion energy analyzer contains a metallic collector, a control grid and a micro-channel plate, all formed into a cylindrical stack where the collector, control grid and micro-channel plate are separated by ceramic insulating washers. A control element is formed within each aperture of the micro-channel plate for controlling a critical angle of each aperture. A voltage is applied to the control element such that an electric field is generated within each micro-channel. By varying the magnitude of the electric field, the critical angle of the micro-channel plate can be electrically controlled, and as such, certain ion trajectories can be selected for entry into the ion energy analyzer.

23 Claims, 3 Drawing Sheets

ION ENERGY ANALYZER WITH AN ELECTRICALLY CONTROLLED GEOMETRIC FILTER

BACKGROUND OF THE DISCLOSURE

1. Field of the Invention

The invention relates to test and measurement apparatus for semiconductor wafer processing systems and, more particularly, to ion energy analyzers having electrically controllable geometric filters.

2. Description of the Prior Art

Ion energy is an important parameter of a plasma contained by a reaction chamber within a semiconductor processing system. During a semiconductor etching process, ion energy affects selectivity of the etch, etch rate uniformity and residue control. Since this parameter is so important to the etch process, the measurement of ion energy at a given location within a reaction chamber is important to characterizing the effectiveness of the plasma in processing a semiconductor wafer.

Under conditions where there is directed ion bombardment perpendicular to the surface of the wafer, plasma etching typically produces anisotropic etching of the wafer surface. In addition to anisotropic etching, spontaneous chemical processes, as a result of ion enhanced chemical reactions proximate the surface of the wafer, typically result in an isotropic etching of the wafer. As such, during the plasma etching process, the ions impart energy either to the lattice structure of the wafer or to the reactant species on the surface of the wafer. The etching yield as well as etch rate uniformity are both a function of the ion bombardment angle and the energy of the bombardment ions. Thus, both ion energy and ion trajectory angle with respect to the wafer surface are important to characterizing a plasma. Consequently, to fully characterize the plasma in plasma etching processes, it is necessary to quantify both the energy and the angle distributions of ions striking the surface of a wafer during etching.

Typically, ion energy analyzers are imbedded into a support structure for the semiconductor wafer, e.g., such support structures are known as wafer chucks, susceptors, or wafer pedestals. An ion energy analyzer is a well-known device for determining the energy properties of ions within a plasma. For a detailed description of a typical gridded ion energy analyzer, see R. L. Stenzel, et al., "Novel Directional Ion Energy Analyzer", Rev. Sci. Instrum. 53(7), July 1982, pp. 1027–1031 which is hereby incorporated by reference. As described therein, a traditional gridded ion energy analyzer contains a metallic collector, a control grid, and a floating grid, all formed into a cylindrical stack where the collector and each grid are separated by a ceramic insulating washer. Specifically, the collector is a negatively biased metallic disk. The negative bias repels electrons from the collector and attracts ions to the collector. The control grid is positively biased such that ions with energies that do not exceed the positive bias are rejected by the analyzer. As such, the control grid is used to select ions for collection that have energy levels greater than a specified energy level and reject all others. The unbiased (floating) grid is a mesh screen that, being unbiased, simulates the surface of a semiconductor wafer.

In operation, the ion energy analyzer imbedded in the pedestal is either used to measure the ion energy prior to having a wafer placed upon the pedestal or a specially designed wafer having a hole to expose the energy analyzer to the plasma is placed upon the pedestal. Once the plasma is established in the chamber, ions having energies exceeding the control grid bias are collected by the collector plate and create an electrical current in an ammeter connected to the collector plate. The energy of the ions in the plasma is determined by adjusting the control grid bias and monitoring the current measured by the ammeter.

To provide fixed geometric filtering such that ions having a particular trajectory are captured by the ion energy analyzer, a micro-channel plate is provided in lieu of the floating grid in the previously described ion energy analyzer. A micro-channel plate generally contains a plurality of capillary channels formed in a fixed pattern through the plate. As such, the micro-channel plate provides depth to each passageway into the ion energy analyzer, and as such, provides ion trajectory discrimination, i.e., the thicker the plate, the more geometrically discriminating the analyzer and the narrower the angle over which incoming ions will be accepted into the analyzer.

More specifically, the plate is typically fabricated of glass, having a plurality of holes (known as micro-channels or micro-capillaries) formed in a honeycomb pattern through the plate. In particular, the plate thickness and micro-channel diameter define a critical angle measured from the long axis of a given micro-channel. Ions entering a micro-channel at a trajectory angle that is greater than the critical angle impact the walls of the micro-channel and do not enter the ion energy analyzer. On the other hand, ions with trajectory angles less than the critical angle pass into the analyzer for further discrimination, i.e., energy discrimination by the discriminator grid. In one prior art utilization of a micro-channel plate in an ion energy analyzer, each of the micro-channels had a diameter of 0.015 millimeters and a length of 0.6 millimeters which defined a critical angle of approximately 0.6 degrees. See R. L. Stenzel, et al., "Novel Directional Ion Energy Analyzer", Rev. Sci. Instrum. 53(7), July 1982, pp. 1027–1031. Of course, for cylindrical holes, the critical angle is a spherical angle. Optionally, the micro-channels can be formed at an angle (other than perpendicular) to the surface of the plate such that ions having a specific trajectory angle, plus or minus the critical angle, are geometrically selected for measurement. Furthermore, to alter the angle at which ions are accepted into the ion energy analyzer, the entire ion energy analyzer may be physically rotated to select certain ions having a specific trajectory angle.

In another prior art ion energy analyzer that determines ion energy with respect to ion trajectory angle, the control grids and the collector plate within the analyzer have a concave shape. See J. Liu, et al., "Ion Bombardment in R.F. Plasmas", J. Appl. Phys. 68(8), 15 October 1990, pp. 3916–3933. In this prior art ion energy analyzer, the collector plate is formed as a plurality of concentric conductive rings, where each ring is capable of individually measuring the energy of ions that impact a particular ring. Because of the concave shape of the collector and the control grid, ions having particular trajectory angles impact a particular collector ring. As such, a plurality of ion energy levels can be measured for each ring, and the ion energies measured at each ring are indicative of the ion energies at specific trajectory angles. Consequently, the ion energy analyzer measures a number of ion energies at specific ion trajectory angles. Thus, the analyzer determines an ion energy distribution with respect to the trajectory angles. In this prior art analyzer, the physical concavity of the collector and control grids define the critical angle.

In each of the prior art ion energy analyzers, the selection of ion angular trajectory is accomplished by physical movement of the analyzer or by physical design of the analyzer. Detrimentally, physical movement of the analyzer is hard to accurately control and can lead to anomalous trajectory measurements. Physical design of an analyzer that is capable of measuring ions at various trajectories are typically complex and costly ion energy analyzers. Therefore, a need exists in the art for an ion energy analyzer that electrically selects ions of various trajectories for measurement.

SUMMARY OF THE INVENTION

The disadvantages heretofore associated with the prior art are overcome by the present invention of an ion energy analyzer having an electrically controlled geometric filter.

Specifically, the present invention is an ion energy analyzer having a micro-channel plate where the geometric filtering characteristics of the micro-channel plate are electrically controlled. The ion energy analyzer contains a metallic collector, a control grid and a micro-channel plate, all formed into a cylindrical stack where the collector, discriminator (or control) grid and micro-channel plate are separated by ceramic insulating washers (annular insulators). Specifically, the collector is a negatively biased metallic disk. The negative bias repels electrons from the collector and attracts ions to the collector. The discriminator grid is positively biased, such that ions with energies that do not exceed the positive bias are rejected by the analyzer. As such, the discriminator grid is used to select ions for collection that have energy levels greater than a specified energy level and reject all others. Each micro-channel in the micro-channel plate is fitted with a control element. A voltage is applied to the control element such that the control element produces an electric field within each micro-channel in the micro-channel plate. The magnitude of the electric field controls the critical angle of each of the micro-channels.

In a first embodiment of the invention the control element is implemented by partially (e.g., semicylindrically) plating the wall of each micro-channel in the micro-channel plate with a conductive material. A biasing voltage is applied to the plated portion of the micro-channel such that an electric field is generated between the unplated portion of the micro-channel and the plated portion. By varying the magnitude of the electric field, the critical angle of the micro-channel plate can be electrically controlled, and as such, specific ion trajectories are selected for entry into the ion energy analyzer. Consequently, the partially plated micro-channel plate forms an electrically controllable geometric filter for the ion energy analyzer.

Alternatively, in a second embodiment of the invention, each cylindrical micro-channel through the micro-channel plate contains a cylindrical, conductive rod that is coaxially positioned within each micro-channel. Each conductive rod is biased with a voltage to create an electric field between the rod and the wall of the micro-channel. The magnitude of the electric field controls the critical angle of the micro-channel and that of the ion energy analyzer as a whole. This alternative embodiment of the invention allows azimuthally integrated measurement of the angular ion energy distribution.

Utilization of either of the embodiments of the invention permits an ion energy analyzer to electrically select the ion trajectory angle to be measured. Consequently, no physical movement or physical alteration of the ion energy analyzer is necessary to selectively geometrically filter the ions within the plasma.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
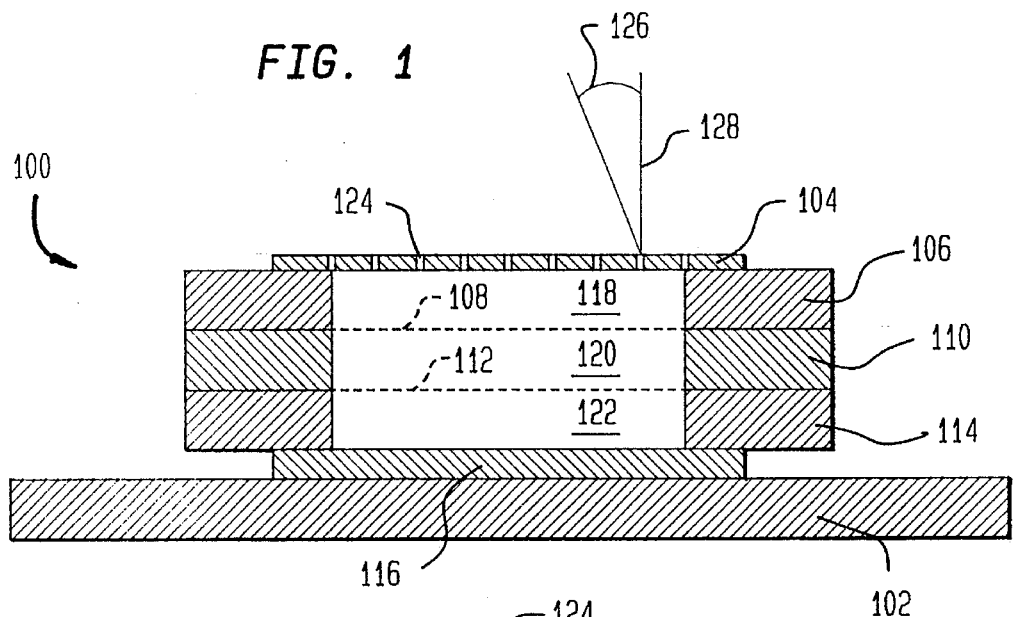
FIG. 1 depicts a cross-sectional view of an ion energy analyzer having an electrically controllable geometric filter in accordance with the preferred embodiment of the invention.
Figure 2A:
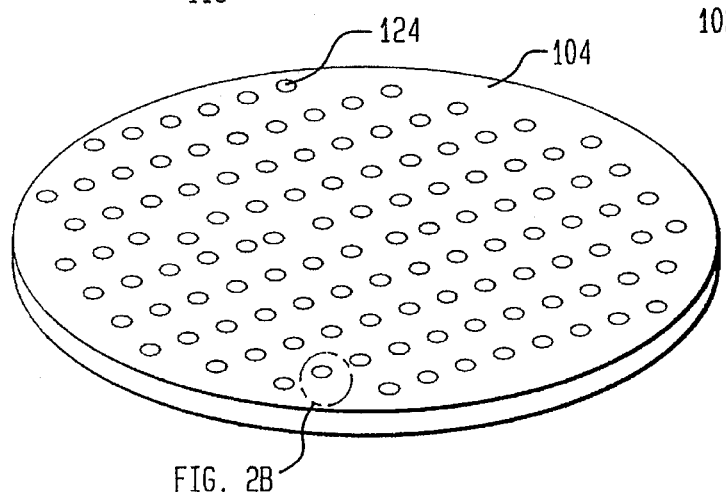
FIG. 2 (A–B) depict a perspective view of the micro-channel plate depicted in FIG. 1 and a close-up perspective view of a single micro-channel within the plate.
Figure 2B:
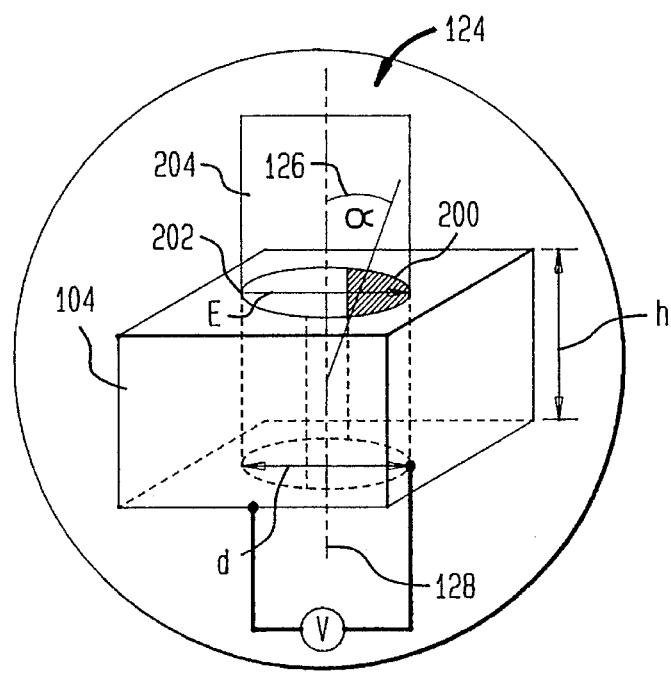

FIG. 1 depicts a cross-sectional view of an ion energy analyzer 100 supported upon a substrate 102. FIG. 2 (A–B) contains a partial cross-section view of a micro-channel plate 104 contained in the ion energy analyzer 100 of FIG. 1. To best understand the invention, the reader should simultaneously consult both FIGS. 1 and 2 (A–B).

Specifically, the substrate 102 is typically an anodized aluminum disk having dimensions equivalent to a semiconductor wafer that it replaces within a semiconductor processing system. In particular, the diameter and thickness of the substrate are the same as a semiconductor wafer, such that the bottom surface of the substrate can be mounted to a chuck or a wafer pedestal within the processing system. The chuck then supports the substrate within the processing system in a location that ensures that the substrate experiences the same ion bombardment from a plasma as a semiconductor wafer would experience in that same location. As such, any measuring instrumentation attached to the substrate measures the environment within the processing system as it would be generated proximate the semiconductor wafer. One illustrative semiconductor wafer processing system that can utilize the present invention is a model Centura DPS metal etch system manufactured by Applied Materials, Inc. of Santa Clara, Calif.

Typically, to fully characterize the ion energy within the plasma, the substrate supports a plurality of ion energy analyzers 100. Additionally, as described in a U.S. patent application entitled "Composite Diagnostic Wafer For Semiconductor Wafer Processing Systems", filed Oct. 31, 1994, Ser. No. 08/331,836, now U.S. Pat. No. 5,451,784, assigned to the assignee of this application and incorporated herein by reference, the substrate may support one or more ion energy analyzers and one or more current probes to form a composite diagnostic wafer. In such an arrangement, the analyzers and the probes are positioned in an array such that the properties of the plasma can best be determined over the entire surface of the wafer.

More specifically, a collector 116 is attached to the substrate 102 using an adhesive. The collector is a disk of conductive material, such as tungsten or stainless steel. The collector is individually connected by wires (not shown) to a voltage source for biasing the collector with an adjustable negative potential.

Atop the collector 116 is positioned an annular insulator 114 containing an aperture 122. The aperture has a diameter that is slightly smaller than the diameter of the collector, e.g., the aperture has a diameter of approximately 0.2 to 0.4 inches. By resting upon the outer edge of the collector, the annular insulator is spaced from the surface of the substrate by the thickness of the collector. A secondary electron repelling grid 112, typically fabricated from a tungsten or stainless steel wire mesh or an etched nickel foil, is positioned over the insulator 114. The grid has a thickness of approximately 4 mils and contains a mesh of approximately 200 lines per inch. Within the aperture 122, the secondary electron repelling grid has a parallel, spaced-apart relation to the collector. The grid and insulator, as well as the other components of the energy analyzer 100 are attached to one another by an adhesive. Alternatively, the component parts of the analyzer could be clamped or screwed to one another.

Although the secondary electron repelling grid 112 is depicted in this embodiment, this grid and its supporting insulator 114 are actually optional. Typically, the secondary electron repelling grid is only used in energy analyzers that experience high ion energies, e.g., energies greater than 10 eV. As such, this description of the invention assumes that the invention is to be used in a high ion energy environment. If, however, the invention is used in a low ion energy environment, those skilled in the art will realize that the secondary electron repelling grid and its supporting insulator do not have to be incorporated into the energy analyzer.

Continuing with the embodiment depicted in FIGS. 1 and 2, another (second) annular insulator 110 is stacked atop the secondary electron repelling grid 112. The insulator 110 has an aperture 120 that is coaxially aligned with the aperture 122 in the secondary electron repelling grid insulator 114. A discriminator grid 108 (also known as control grid) is placed atop the insulator 110. The discriminator grid is typically fabricated as a tungsten or stainless steel wire mesh or an etched nickel foil. A third annular insulator 106 is positioned atop the discriminator grid 108. The third insulator 106 also contains an aperture 118 that is coaxially aligned with the apertures 120 and 122 in the underlying insulators 110 and 114. To complete the energy analyzer, a micro-channel plate 104 is placed upon the third insulator 106. This plate is typically fabricated of glass, having a plurality of holes 124 (or micro-channels) formed in a honeycomb pattern through the plate. Although the micro-channels are typically cylindrical, other shapes, e.g., square, rectangular, oval, polygonal and the like, may be used. Using such a micro-channel plate provides a trajectory discrimination scheme known as a geometric filter.

In particular, the plate thickness and micro-channel diameter define a critical angle 126 measured from a long axis 128 of a given micro-channel. Ions entering a given micro-channel at a trajectory angle that is greater than the critical angle impact the walls of the micro-channel and do not enter the ion energy analyzer. On the other hand, ions with trajectory angles less than the critical angle pass into the analyzer for further discrimination (energy discrimination) by the discriminator grid. Of course, for cylindrical holes, the critical angle is a spherical angle centered on the long axis of a given micro-channel.

To provide control of the critical angle, a control element is fabricated in each of the micro-channels. Specifically, a semicylindrical portion 200 of the wall of each of the micro-channels is plated with a conductive material such as aluminum. The plated semicylindrical portion of the wall 200 is connected to a voltage source (not shown). In operation, an electrical charge builds up on the surface of the glass micro-channel plate due to the RF field used during plasma generation. By applying a DC bias voltage to the plated wall 200 of the micro-channel, an electric field E is produced between the non-plated wall 202 and the plated wall 200 within each of the micro-channels. Adjusting the DC bias voltage relative to the charge on the plate changes the magnitude of the electric field to alter the critical angle of the micro-channel. In response to the voltage adjustment, the micro-channel selects ions having trajectories within the selected critical angle to enter the ion energy analyzer. Within each micro-channel, the electric field actually alters the trajectories of the ions (bends the trajectories) such that by varying the bias voltage, various ion trajectory angles can be selected to be within the critical angle defined by the physical dimensions of the micro-channels. In this embodiment of the invention, the selected trajectory angle is the angle relative to the long axis of the micro-channel and within a plane of the electric field (indicated by plane 204). Note that angle selection is in a single direction, e.g., the plane of the electric field.

The critical angle of the micro-channel having a particular voltage applied thereto is dependent upon the energy of the ions, e.g., an ion with relatively high energy bends less in a given electric field than an ion with a relatively low energy level. Thus, to achieve an accurate measure of ion energy and ion trajectory angle, the energy and angle must be deconvolved. Within the plane of the electric field and disregarding any three-dimensional effects, the energy and angle are generally related to one another through the following equation (assuming the electric field is in the z–x plane and an ion is traveling in the z–x plane):

$$\frac{d}{2h} = \frac{\cos\alpha}{\sin\alpha} + \frac{qVh}{2d} \frac{1}{kE_i\sin^2\alpha} \tag{1}$$

where:

α=critical angle in the z–x plane $E_i$=ion total energy (eV)

k=1.6×10$^{-19}$ J/eV

V=voltage across the micro-channel q=1.6×10$^{-19}$ C d=diameter of the micro-channel h=height (length) of the micro-channel Using Equation 1, the critical angle for a particular voltage (V) can be calculated for a given ion energy ($E_i$). Consequently, distributions of ion energy and ion trajectory angle can be determined. Equation 1 is a simple example of an illustrative method to deconvolve ion trajectory angle and ion energy. Those skilled in the art will realize that many other more complicated methods for deconvolution are available and utilization of these other methods are within the scope of this invention.

Figure 3A:
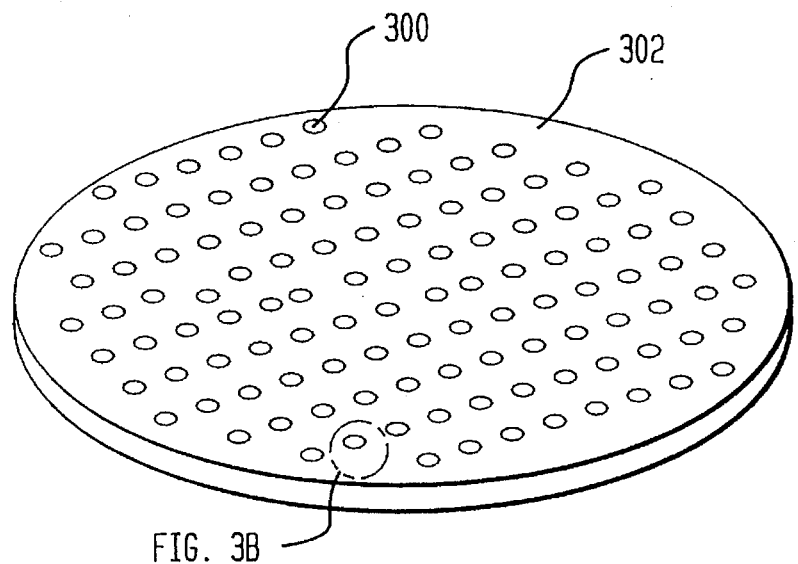
FIG. 3 (A–B) depict a perspective view of an alternative embodiment of the micro-channel plate and a close-up perspective view of a single micro-channel within the plate.
Figure 3B:
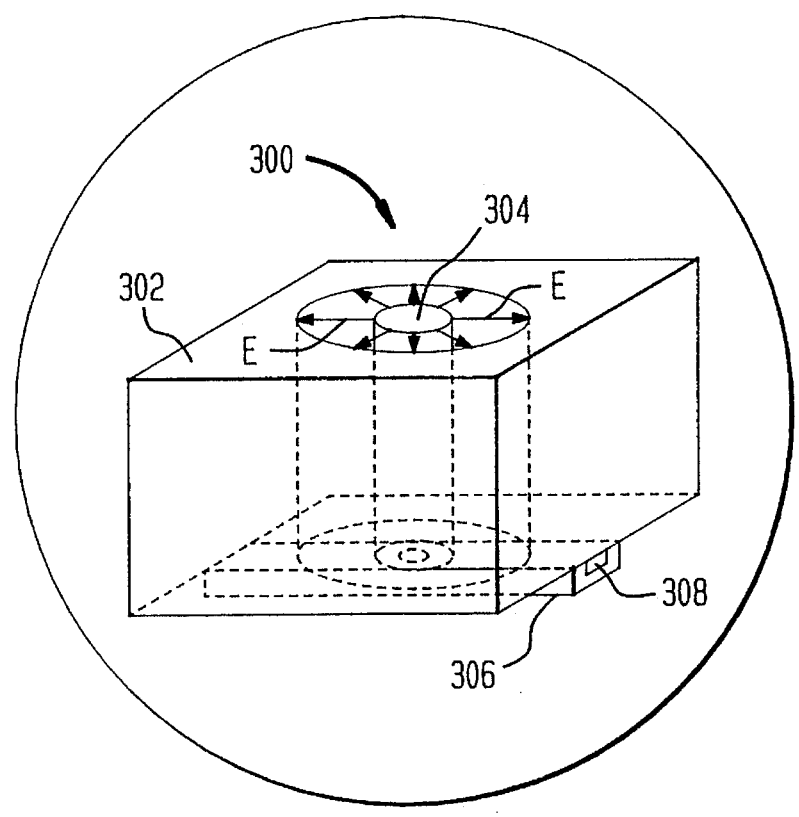

FIG. 3(A–B) depicts an alternative embodiment of a micro-channel 300 within a micro-channel plate 302 that forms an electrically controlled geometric filter. In this embodiment, to form the control element, each micro-channel is a cylindrical hole through the micro-channel plate. Within each cylindrical hole, coaxially therewith, is a conductive rod 304. The rod 304 is supported at one end by a support portion 306. The support portion is an insulator surrounding a conductor 308. The conductor is connected to the end of the rod. As such, the conductor supplies a bias voltage to the rod. In operation, a DC bias voltage is applied to the conductive rod 304 via the conductor 308 such that an electric field is radially generated between the conductive rod and the inner wall of the micro-channel. During operation of the analyzer, an electrical charge builds up on the surface of the glass micro-channel plate due to the RF field used during plasma generation. By adjusting the magnitude of the DC bias voltage relative to the charged surface of the plate, the magnitude of the electric field is adjusted to alter the critical angle. Since in this embodiment the electric field is a radial electric field, the critical angle is a spherical angle. To deconvolve the ion trajectory angle from the ion energy, Equation 1 can be modified to accommodate a spherical coordinate system.

Figure 4:
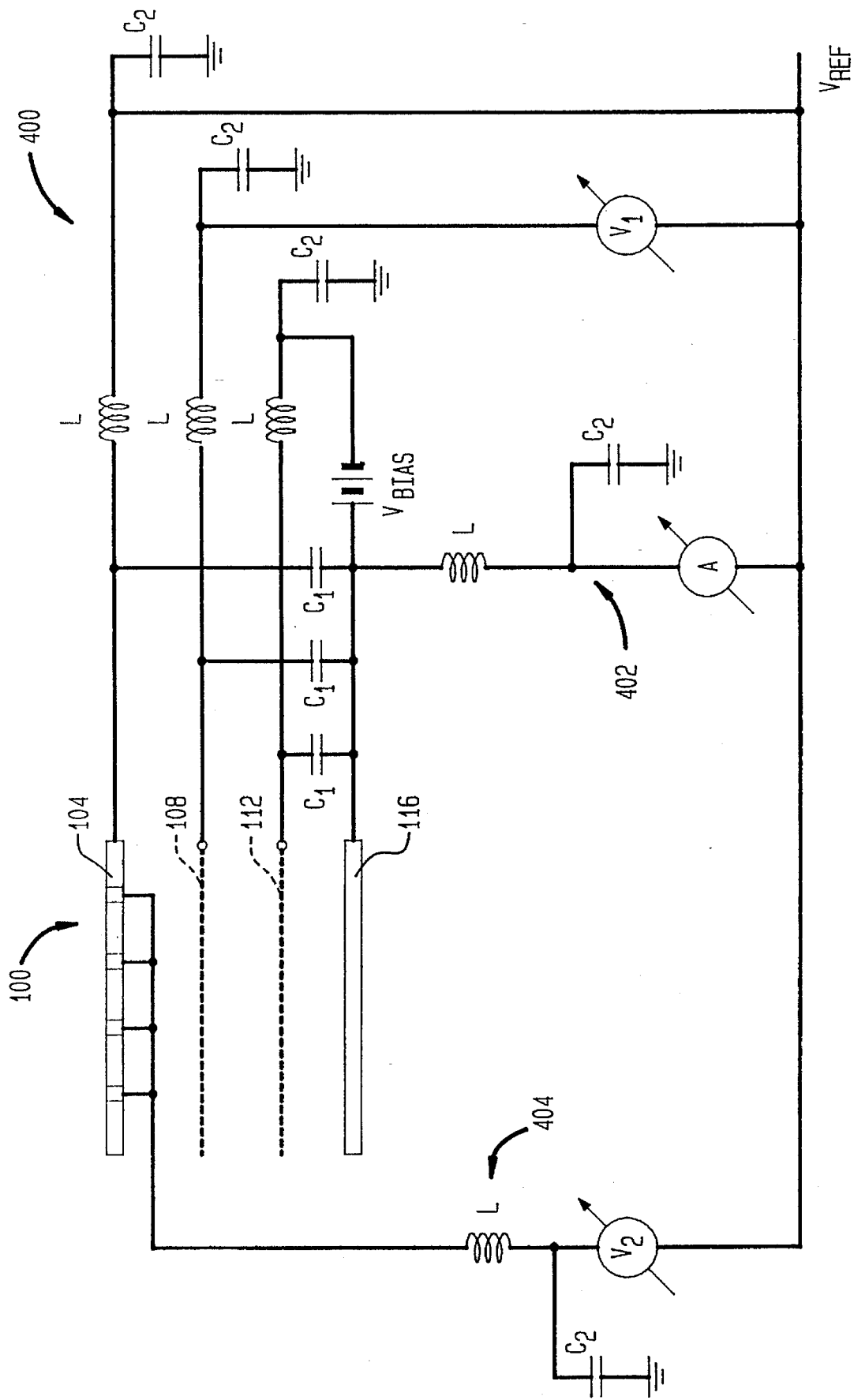
FIG. 4 depicts a schematic diagram of a circuit for biasing the various grids and for controlling the geometric filter within the ion energy analyzer of FIG. 1.

FIG. 4 depicts a schematic drawing of a circuit 400 used to bias an energy analyzer 100. The micro-channel plate 104 is unbiased such that it accumulates a bias in the same manner as the surface of a semiconductor wafer accumulates a DC bias from being exposed to RF energy that biases the chuck within the reaction chamber. If, for some reason, the plate does not accumulate the proper bias to simulate the surface of a semiconductor wafer, a voltage $V_{REF}$ can be used to correctly bias the plate. The discriminator grid 108 is positively biased with reference to voltage $V_{REF}$, typically by a ramped DC voltage from voltage source $V_1$. The ramped voltage has an amplitude that typically begins at zero volts and ends at a voltage greater than the sum of the expected DC bias on the wafer plus the amplitude of the RF voltage used to bias the chuck. By having a swept (ramped) discriminator grid voltage, the measurement instrumentation determines an ion energy distribution. Of course, other voltage waveforms may be applied to the discriminator grid besides the ramped voltage.

The secondary electron repelling grid 112 is biased somewhat more negative than the collector, which is generally biased to approximately −200 volts ($V_{BIAS}$). By having such a bias on the secondary electron repelling grid, any electrons emitted from the collector due to bombardment of the collector by ions, are repelled by grid 112 back toward the collector. Each grid is coupled through a capacitor $C_1$ to the collector to ensure that the grids are RF coupled to the collector. Each combination of inductor L and capacitor $C_2$ forms a low pass filter to block RF energy from effecting the measurement equipment (e.g., ammeter A) or the power supplies (e.g., $V_{BIAS}$, $V_{REF}$, and voltage sources $V_1$ and $V_2$).

The ions collected by the collector 116 cause an electric current in a wire connected to the collector. To determine the energy distribution of the ions, current analyzing instrumentation (e.g., ammeter A) is connected, through low pass filter 402, to the collector 116. As the voltage on the discriminator grid 112 is swept, the collector 116 is able to collect only ions within the critical angle established by voltage $V_2$ and having energy levels that overcome the repulsive force produced by the discriminator grid.

Each channel in the micro-channel plate is biased by voltage $V_2$ through low pass filter 404. This voltage is on the order of 200 mV to 1 volt greater than the voltage $V_{REF}$. Importantly, this relatively small voltage level provides only a small change in total ion energy as an ion passes through the micro-channel. Thus, the measured ion energy levels are not significantly changed by using the electrically controlled geometric filter.

By using the invention, an ion trajectory angle can be accurately selected without physically altering the position of the analyzer to select a particular ion trajectory angle. Specifically, the invention is an improved ion energy analyzer that is capable of electrically differentiating various ion trajectory angles. This improved ion energy analyzer is not substantially more complex than conventional ion energy analyzers and, as such, is not significantly more expensive to fabricate than conventional analyzers. Furthermore, since trajectory angle selection is electrically controlled, the complicated and inaccurate physical motion control apparatus used in the prior art to physically select a trajectory angle is no longer necessary. Consequently, the present ion energy analyzer invention is substantially improved over the prior art ion energy analyzers.

Although various embodiments which incorporate the teachings of the present invention have been shown and described in detail herein, those skilled in the art can readily devise many other varied embodiments that still incorporate these teachings.

What is claimed is:

1. An electrically controlled geometric filter for an ion energy analyzer comprising:

a micro-channel plate located at an ion entrance aperture within said ion energy analyzer; and means, connected to said micro-channel plate, for electrically controlling a critical angle of said micro-channel plate.

2. The filter of claim 1 wherein said electrically controlling means further comprises:

means for generating an electric field within at least one micro-channel in said micro-channel plate.

3. The filter of claim 2 wherein said electric field generating means further comprises:

a conductive plating covering a semicylindrical portion of a wall of said micro-channel; and a voltage source, connected to said plating and said micro-channel plate, for applying a voltage between said plating and said micro-channel plate to generate an electric field across said micro-channel.

4. The filter of claim 2 wherein said electric field generating means further comprises:

a conductive rod positioned coaxially with said micro-channel; and a voltage source, connected to said conductive rod and said micro-channel plate, for applying a voltage between said conductive rod and walls of said micro-channel to radially generate an electric field between said rod and said walls of said micro-channel.

5. An ion energy analyzer comprising:

a collector plate mounted to a substrate;

a discriminator grid annular insulator, attached to said collector plate, having a central aperture aligned with a center of said collector plate;

a discriminator grid, attached to said discriminator grid annular insulator, spanning said central aperture thereof and spaced apart from said collector plate;

a micro-channel plate annular insulator, attached to said discriminator grid, having a central aperture aligned with a center of said central aperture of said discriminator grid annular insulator;

a micro-channel plate, attached to said micro-channel plate annular insulator, spanning said central aperture thereof and spaced apart from said discriminator grid; and means for electrically controlling a critical angle of said micro-channel plate.

6. The ion energy analyzer of claim 5 further comprising:

a secondary electron repelling grid annular insulator positioned between said collector plate and said discriminator grid annular insulator, having a central aperture aligned with the center of said collector plate; and a secondary electron repelling grid, attached to said secondary electron repelling grid annular insulator, spanning said central aperture thereof and spaced apart from said collector plate and said discriminator grid.

7. The ion energy analyzer of claim 5 wherein said electrically controlling means further comprises:

means for generating an electric field within at least one micro-channel in said micro-channel plate.

8. The ion energy analyzer of claim 7 wherein said electric field generating means further comprises:

a conductive plating covering a semicylindrical portion of a wall of said micro-channel; and a voltage source, connected to said plating and said micro-channel plate, for applying a voltage between said plating and said micro-channel plate to generate an electric field across said micro-channel.

9. The ion energy analyzer of claim 7 wherein said electric field generating means further comprises:

a conductive rod positioned coaxially within said micro-channel; and a voltage source, connected to said conductive rod and said micro-channel plate, for applying a voltage between said conductive rod and a wall of said micro-channel to radially generate an electric field between said rod and said wall of said micro-channel.

10. An electrically controlled geometric filter for an ion energy analyzer comprising:

a micro-channel plate accepting charged particles for filtering and passage into said analyzer;

said micro-channel plate defining a plurality of channels therethrough having axes generally transverse to a face of said micro-channel plate, each channel thereof having an entrance aperture geometrically predetermining an angular range of acceptable charged particle trajectories over which said channel accepts charged particles for passage therethrough;

at least one electrode within each said channel oriented generally in the channel axial direction, said electrode area being adapted to accept a control signal from a source of variable electrical potential, said electrode being capable of establishing an electric field generally transverse to the channel axial direction; and said geometrically predetermined range of acceptable particle trajectories being electrically variable by varying said electric field in response to said control signal.

11. The filter of claim 10 wherein said electrode further comprises a conductive plating covering a semicylindrical portion of each said channel, said source of variable electric potential being connected to said plating and said micro-channel plate for applying the control signal between said plating and said micro-channel.

12. The filter of claim 10 wherein said electrode further comprises a conductive rod positioned coaxially within each said channel, said source of variable electric potential being connected to said rod and said micro-channel plate for applying the control signal between said rod and said micro-channel.

13. An ion energy analyzer comprising:

a collector plate mounted to a substrate;

a discriminator grid annular insulator, attached to said collector plate, having a central aperture aligned with a center of said collector plate;

a discriminator grid, attached to said discriminator grid annular insulator, spanning said central aperture thereof and spaced apart from said collector plate;

a micro-channel plate annular insulator, attached to said discriminator grid, having a central aperture aligned with a center of said central aperture of said discriminator grid annular insulator;

a micro-channel plate, attached to said micro-channel plate annular insulator, spanning said central aperture thereof and spaced apart from said discriminator grid;

said micro-channel plate defining a plurality of channels therethrough having axes generally transverse to a face of said micro-channel plate, each channel thereof having an entrance aperture geometrically predetermining an angular range of acceptable charged particle trajectories over which said channel accepts charged particles for passage therethrough;

at least one electrode within each said channel oriented generally in the channel axial direction, said electrode area being adapted to accept a control signal from a source of variable electrical potential, said electrode being capable of establishing an electric field generally transverse to the channel axial direction; and said geometrically predetermined range of acceptable charged particle trajectories being electrically variable by varying said electric field in response to said control signal.

14. The ion energy analyzer of claim 13 wherein said electrode further comprises a conductive plating covering a semicylindrical portion of each said channel, said source of variable electric potential being connected to said plating and said micro-channel plate for applying the control signal between said plating and said micro-channel.

15. The ion energy analyzer of claim 13 wherein said electrode further comprises a conductive rod positioned coaxially within each said channel, said source of variable electric potential being connected to said rod and said micro-channel plate for applying the control signal between said rod and said micro-channel.

16. A method of fabricating an electrically controllable geometric filter for an ion energy analyzer comprising the steps of:

forming an aperture in a micro-channel plate; and creating, within said aperture, an element for controlling a critical angle of the aperture.

17. The method of claim 16 further comprising the steps of:

applying a voltage to the element; and varying the voltage to control the critical angle of the aperture.

18. The method of claim 16 wherein said creating step further comprises the steps of:

plating a semicylindrical portion of the aperture with an electrically conductive material; and applying a voltage to said micro-channel plate and said plating to generate an electric field across the aperture.

19. The method of claim 16 wherein said creating step further comprises the steps of:

forming, coaxially within the aperture, a rod of electrically conductive material; and applying a voltage to said micro-channel plate and said rod to radially generate an electric field between said rod and a wall of said aperture.

20. The method of claim 16 wherein said forming step further comprises the step of forming a plurality of apertures in said micro-channel plate and said creating step further comprises the step of creating, within each of the apertures, an element for simultaneously controlling the critical angle of each of the apertures.

21. The method of claim 20 wherein said creating step further comprises the steps of:

plating a semicylindrical portion of each of the apertures with an electrically conductive material; and applying a voltage to said micro-channel plate and said plating of each of the apertures to generate an electric field across each of the apertures.

22. The method of claim 20 wherein said creating step further comprises the steps of:

forming, coaxially within each of the apertures, a rod of electrically conductive material; and applying a voltage to said micro-channel plate and said rod in each of the apertures to radially generate an electric between said rod and a wall of each of said apertures.

23. The method of claim 20 further comprising the steps of:

applying a voltage to each of the elements in each of the apertures; and varying the voltage to control the critical angle of each of the apertures.

* * * * *